United States Patent [19]

Hansen et al.

[11] 4,365,213
[45] Dec. 21, 1982

[54] LOW FREQUENCY ASTABLE OSCILLATOR HAVING SWITCHABLE CURRENT SOURCES

[75] Inventors: Kenneth A. Hansen, Bedford, Tex.; Ronald H. Chapman, Wheaton, Ill.

[73] Assignee: Motorola Inc., Schaumburg, Ill.

[21] Appl. No.: 197,386

[22] Filed: Oct. 16, 1980

[51] Int. Cl.³ .................. H03K 3/282; H03B 5/36
[52] U.S. Cl. ........................ 331/113 R; 331/116 R
[58] Field of Search ............. 331/113 R, 116 R, 144, 331/145; 307/271, 273

[56] References Cited

U.S. PATENT DOCUMENTS

| | | |
|---|---|---|
| 3,152,306 | 10/1964 | Cooper et al. |
| 3,217,269 | 11/1965 | Rowley et al. |
| 3,295,069 | 12/1966 | Perry |
| 3,380,002 | 4/1968 | Hogue ........................ 331/113 R |
| 3,434,051 | 3/1969 | Newhoff .................. 331/113 R X |
| 3,566,301 | 2/1971 | Grangaard, Jr. |
| 3,581,235 | 5/1971 | Siu |
| 3,613,029 | 10/1971 | Bartlett |
| 3,623,147 | 11/1971 | Scheerer |
| 3,688,213 | 8/1972 | Calaway |
| 4,216,442 | 8/1980 | Wheatley, Jr. ............. 331/113 R |
| 4,286,234 | 8/1981 | Denny ....................... 331/113 R |

OTHER PUBLICATIONS

"Bipolar Micropower Circuits for Crystal-Controlled Timepieces", The Journal of Solid-State Circuits, vol. SC-7, No. 2, Apr., 1972.

Primary Examiner—Siegfried H. Grimm
Assistant Examiner—Edward P. Westin
Attorney, Agent, or Firm—James S. Pristelski; Edward M. Roney; James W. Gillman

[57] ABSTRACT

A low frequency oscillator of the astable type having good frequency stability, fast starting, good immunity to DC loading, and suitable for fabrication in integrated circuit form. First and second switching transistors of the astable multivibrator are cross-coupled by a coupling capacitor and a frequency determining crystal. Base drive to the respective switching transistors and charging current to the capacitor and crystal are provided by a pair of differential amplifiers which are referenced to a forward biased diode. The differential amplifiers are also connected to respective collector terminals of the switching transistors. The capacitor is of small value suitable for containment within an integrated circuit with the oscillator circuit. The differential amplifiers substantially increase the impedance levels in the oscillator and shift base drive to the switching transistors to minimize the effects of DC loading at the output terminals of the oscillator.

4 Claims, 1 Drawing Figure

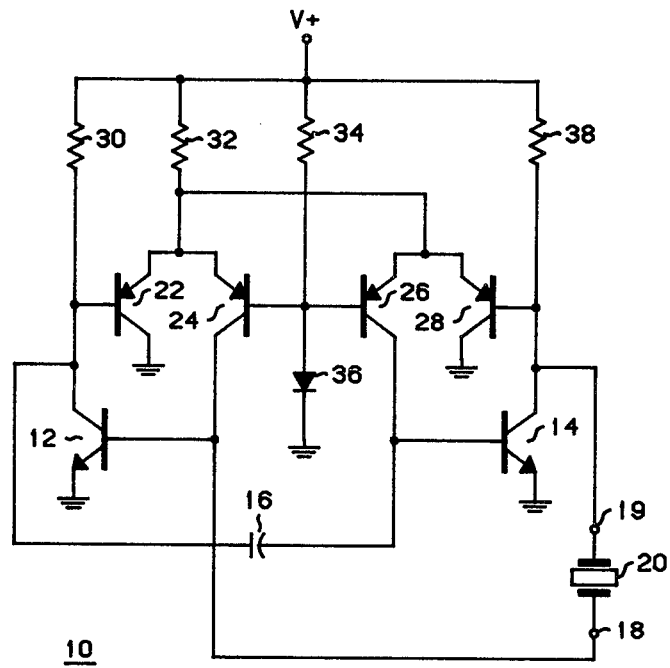

LOW FREQUENCY ASTABLE OSCILLATOR HAVING SWITCHABLE CURRENT SOURCES

BACKGROUND OF THE INVENTION

This invention pertains to low frequency oscillators and, more particularly, to low frequency oscillators of the astable multivibrator type having good frequency, stability, high gain, fast starting, good immunity to DC loading at the output terminals and which may be fabricated in integrated circuit form.

In the past, various types of oscillator circuits have been used to generate relatively low frequency signals. However, a low frequency necessarily means a correspondingly high time constant. For those types of oscillators employing resistive-capacitive networks, high time constants translate into high resistive values and/or high capacitive values. Of course, high resistive values and high capacitive values necessarily mean that it is impractical to adapt such low frequency oscillators to integrated circuit form. In some instances, the high resistive and/or capacitive values are provided as external components to the integrated circuit. However, this arrangement is not entirely satisfactory since it increases the number of pins or external connections to the integrated circuit and makes the oscillator more susceptible to stray circuit effects such as parasitic capacitance and leakage currents.

Even when low frequency oscillators are designed and built, there is a need in the communications arts, and particularly in private line encoder/decoder applications, for the low frequency oscillator to have a high degree of frequency stability, with respect to temperature and voltage supply variations. As is well-known to the art, private line communication systems typically use a low frequency tone signal to selectively enable communications between selected parties using the same communications channel. The tones used for private line communications are typically below the lowest audio frequencies passed by the communications system. For example, a number of different tones may be employed which have frequencies below about 300 Hz. In order to provide for as many private lines as possible, both the transmitting and receiving radio equipment must have high frequency accuracy and stability so that the tones may be closely spaced without interference from, or falsing due to, adjacent tones.

It is known to the prior art to use an astable multivibrator as an oscillator wherein one of the cross-coupling capacitors in the multivibrator is replaced by a frequency determining element, such as a crystal having predetermined frequency characteristics. However, such an oscillator is limited in its utility since low frequency applications typically require high resistances in the collector circuits of the switching transistors and a relatively high cross-coupling capacitance between the respective transistors in addition to the crystal. As discussed above, such requirements are not generally compatible with integrated circuit fabrication techniques. Furthermore, as the impedance levels increase, the oscillator generally tends to be slower in its starting characteristics. It is important in private line communications applications that the oscillator have a fast starting characteristic such that the desired private line tone can be generated and detected quickly at the desired time in the respective encoders and decoders.

Since the output terminals of the oscillator are intended to provide the oscillator output signal to other circuitry, the output of the oscillator is subject to a load. The load may vary subject to temperature or voltage supply variations or may otherwise be time-varying. It is well known that loading affects start-up performance of oscillators and can further affect frequency stability.

SUMMARY OF THE INVENTION

Accordingly, it is a principle object of the present invention to provide a low frequency oscillator of the astable multivibrator type which is suitable for fabrication in integrated circuit form.

A related object of the present invention is to provide a pair of differential amplifiers, in place of the typical base resistors in the astable multivibrator, to significantly increase the impedance levels in the multivibrator such that a small capacitor, compatible with integrated circuit fabrication techniques, may be utilized.

A further object of the present invention is to provide a stable low frequency oscillator of the astable multivibrator type which is relatively insensitive to external DC loading at the oscillator output terminals.

Briefly, the low frequency oscillator of the present invention is of the astable multivibrator type having high gain, fast starting and good immunity to DC loading at the output terminals. The astable multivibrator includes a first switching transistor and a second switching transistor with the emitter electrodes of each transistor coupled to a predetermined DC reference level, such as ground potential. The base electrode of the first transistor is adapted to be connected to the collector electrode of the second transistor through a frequency determining element, such as a frequency determining crystal, and the base electrode of the second transistor is coupled to the collector electrode of the first transistor through a cross-coupling capacitor. A first differential amplifier means is coupled to the base electrode of the first transistor to bias and control the base drive for the first transistor and to charge the frequency determining element, and a second differential amplifier means is coupled to the base electrode of the second transistor to bias and control the base drive for the second transistor and to charge the coupling capacitor. Each of the differential amplifiers operate as switchable current sources and are referenced to a voltage reference level; typically, a forward biased diode. The other inputs to the differential amplifiers are respectively coupled to the collectors of the respective switching transistors. With the impedance levels obtained by the differential amplifiers in the base to collector circuits of the respective transistors, the impedance levels in the oscillator are significantly increased, without sacrifice of gain or starting characteristics in the astable multivibrator. The cross-coupling capacitor can therefore be significantly reduced in capacitive value and yet obtain the desired RC time constant for low frequency operation such that the capacitor is of suitable size for fabrication within an integrated circuit embodiment of the oscillator. The differential amplifier pairs, in combination with the voltage reference level, further provide the low frequency oscillator with high frequency stability with respect to variations in temperature and voltage supply and with good immunity to DC loading at the output terminals.

BRIEF DESCRIPTION OF THE DRAWING

The single drawing FIGURE is a schematic diagram illustrating the low frequency astable multivibrator of the present invention.

DESCRIPTION OF THE PREFERRED EMBODIMENT

Referring to the drawing FIGURE, there is shown an oscillator circuit, generally designated 10, of the astable multivibrator type having a first switching transistor 12 and a second switching transistor 14. Transistors 12 and 14 are both of the NPN type. Transistors 12 and 14 each have emitter electrodes referenced directly to ground, or other suitable DC reference level. In a manner known to the astable multivibrator art, the collector electrode of transistor 12 is coupled to the base electrode of transistor 14 by a cross-coupling capacitor 16. The base electrode of transistor 12 is provided at an output terminal 18 and the collector electrode of transistor 14 is similarly provided at an output terminal 19. A frequency determining element, such as a crystal 20, is typically provided between output terminals 18 and 19 such that the output frequency of the oscillator 10 may be accurately determined by the crystal 20. The collector electrode of transistor 12 is also connected to the positive voltage supply V+ through a resistor 30 and the collector of transistor 14 is similarly connected to the positive voltage supply through a resistor 38.

In accordance with one aspect of the present invention, there is provided a first differential amplifier consisting of a pair of PNP transistors 22 and 24 to bias the base electrode of the first switching transistor 12 and to further provide charging current to the crystal 20. In a related manner, there is also provided a second differential amplifier consisting of PNP transistors 26 and 28 to similarly bias the base electrode of the second switching transistor 14 and to provide charging current to capacitor 16. Transistor 22 of the first differential amplifier has its base connected to the collector electrode of the first switching transistor 12 and to one side of the resistor 30. Its collector is connected directly to ground. The emitter electrode of transistor 22 is connected with emitter electrode of transistor 24 through a biasing resistor 32 to the positive voltage supply V+. The base electrode of transistor 24 is connected to a voltage reference consisting of a diode 36 which is forward biased by resistor 34 connected between the positive voltage supply V+ and the anode terminal of diode 36. The cathode of diode 36 is connected directly to ground. Of course, current sources could be substituted for resistors 32 and 34 to provide improved oscillator performance where variation or drift in the voltage supply V+ is expected.

The second differential amplifier for biasing and controlling the second switching transistor 14 is also biased by resistor 32 which is connected to the emitter electrodes of transistors 26 and 28. The base electrode of transistor 26 is connected to the voltage reference provided by the forward biased diode 36. The base electrode of transistor 28 is connected to the collector of transistor 14 and to the positive voltage supply V+ through resistor 38. The collector electrode of transistor 28 is connected directly to ground. The collector electrode of transistor 26 is connected to the base electrode of the second switching transistor 14 and to one side of capacitor 16.

The differential amplifier pairs consisting of transistors 22 and 24 and transistors 26 and 28 provide a much higher impedance level at the respective bases of transistors 12 and 14 than could typically be obtainable from a single resistor fabricated in an integrated circuit. Essentially, the differential amplifiers operate as switchable current sources. This enables a relatively low capacitance value to be used for the coupling capacitor 16. For example, for an oscillator operating at 32,768 Hz, the value of capacitor 16 can be about 10 picofarads which is compatible with fabrication and containment of capacitor 16 within an integrated circuit. Without the differential amplifiers, base biasing resistors for respective transistors 12 and 14 would have to be on the order of many megohms to obtain operation at the desired low frequency. It will be readily appreciated by those skilled in the art that such resistive values are not compatible with typical integrated circuit fabrication techniques.

Insertion of the differential amplifiers into the circuit of the oscillator 10 does not significantly affect the start up of the oscillator. This is because first switching transistor 12 and second switching transistor 14 remain cross-coupled in the usual astable multivibrator configuration and the differential amplifiers in combination with resistors 30 and 38 initially bias transistors 12 and 14 into the linear region during start-up.

The low frequency oscillator of the present invention also substantially eliminates DC loading problems at the output terminal 18. The differential amplifiers consisting of transistors 22 and 24 and transistors 26 and 28 are typically designed to supply the necessary base drive current under normal unloaded conditions. If a DC leakage load is present at output terminal 18, the differential amplifiers will adjust to supply the excess current to accordingly drive the base electrodes of the respective transistors 12 and 14 with greater current drive to minimize the effects of DC leakage or loading.

Basic switching action of the oscillator circuit 10 is as follows. Assume that transistor 12 has just switched to a conductive or ON state and that transistor 14 is therefore in an non-conductive or OFF state. With transistor 12 in an ON state, its collector voltage will drop to a low value near ground potential which is determined by its saturation characteristics. The terminal of capacitor 16 which is connected to the collector electrode of transistor 12 is therefore held essentially at the ground potential to which the emitter electrode of transistor 12 is connected. The base terminal of transistor 22 is then at a lower potential than the base terminal of transistor 24 and substantially all of the current flowing through the first differential amplifier is diverted through the collector terminal of transistor 22 to ground. At the same time, due to the emitter of transistor 22 being brought equal in potential to the base of transistor 26, no current flows through transistor 26 to charge capacitor 16. That is, since transistor 22 is initially turned ON quite hard by transistor 12 and since the emitters of transistors 22, 24, 26 and 28 are connected together at resistor 32, transistor 22 will initially divert current from transistors 26 and 28 as well as from transistor 24. Thus, charging current from transistor 26 to capacitor 16 will be interrupted. During this half cycle of the oscillator, transistor 12 receives base drive from crystal 20. When current from crystal 20 is no longer sufficient to bias transistor 12 in a conductive state, transistor 12 starts to turn OFF and transistor 22 no longer diverts current from transistor 26. Transistor 26 begins to supply drive current to the base of transistor 14 which renders it conductive. At the same time, transistor 24 is rendered conductive and begins to charge crystal 20. Transistor 14 temporarily goes into saturation due to base drive from capacitor 16. At this transitional time, transistor 28 temporarily diverts current from transistors 22, 24 and 26 and transistor 14 remains conductive because of current supplied from capacitor 16 to the base of transistor 14. As capacitor 16 is discharged, the voltage on the collector of transistor 14 will rise to its quiescent conductive state of about 0.7 volts and remain in this condition until the end of the second half cycle of the crystal oscillation. Thus, transistor 26 will begin supplying base drive to transistor 14 and continue to charge capacitor 16 and transistor 24 will again supply charging current to crystal 20. Eventually, the crystal will become sufficiently charged to forward bias the base-emitter junction of transistor 12 and transistor 12 will begin turning ON to start the oscillation cycle anew.

Since capacitor 16 and crystal 20 charge until respective base to emitter junctions of transistors 14 and 12 become forward biased, and since the differential amplifiers consisting of transistors 22 and 24 and transistors 26 and 28 are referenced to the voltage reference provided by the forward biased diode 36, the oscillator 10 is temperature compensated. It is of course well-known that if diode 36 and the emitter to base junctions of transistors 12 and 14 are formed as part of a common integrated circuit that such temperature compensation will be even more effective and accurate.

While an embodiment of the present invention has been shown and described, it will be obvious to those skilled in the art that changes and modifications may be made without departing from the invention in its broader aspects, and, therefore, the aim of the appended claims is to cover all such changes and modifications as fall within the true spirit and scope of the invention.

We claim:

1. A low frequency oscillator of the astable type comprising:
   first switching transistor means having emitter, base and collector electrodes;
   second switching transistor means having emitter, base and collector electrodes;
   said emitter electrodes of said first and second switching transistor means coupled to a predetermined DC reference level;
   the base electrode of the first transistor means adapted to be connected to the collector electrode of the second transistor means through a frequency determining element;
   capacitive means cross-coupling the base electrode of the second transistor means to the collector electrode of the first transistor means;
   first switchable current source means coupled to the base electrode of said first switching transistor means to supply base drive to the first switching transistor means and to provide charging current to the frequency determining element;
   second switchable current source means coupled to the base electrode of the second switching transistor means to supply base drive to the second switching transistor means and to provide charging current to the cross-coupling capacitive means; and
   said first and second switchable current source means respectively including first and second differential amplifier means, a first input of each of the respective differential amplifier means referenced to a reference voltage, a second input of the first differential amplifier means coupled to the collector electrode of the first switching transistor means, and a second input of the second differential amplifier means coupled to the collector electrode of the second switching transistor means.

2. The low frequency oscillator is defined in claim 1 further comprising:
   means for connecting the base electrode of said first switching transistor means to a first output terminal;
   means for connecting the collector electrode of said second switching transistor means to a second output terminal;
   said first differential amplifier means biased to provide the necessary current to the base electrode of the first switching transistor means when said first switching transistor means is in a conductive state;
   said second differential amplifier means biased to provide the necessary current to the base electrode of said second switching transistor means when said second switching transistor means is in a conductive state; and
   said first and second differential amplifier means being responsive to any external DC loading at the first output terminal to provide additional base drive to the respective first switching transistor means to minimize the effects of the DC loading at the first output terminal.

3. The low frequency oscillator as defined in claim 1 wherein said reference voltage comprises a forward biased diode to provide a temperature stable oscillator output signal by matching the temperature characteristics of the base to emitter junctions of the first and second switching transistor means.

4. The low frequency oscillator as defined in claim 1 wherein said capacitive cross-coupling means is on the order of 10 picofarads.

* * * * *